US006940255B2

(12) United States Patent
Loch (10) Patent No.: US 6,940,255 B2
(45) Date of Patent: Sep. 6, 2005

(54) BATTERY CHARGE INDICATOR SUCH AS FOR AN IMPLANTABLE MEDICAL DEVICE

(75) Inventor: Robert Loch, Woodbury, MN (US)

(73) Assignee: Cardiac Pacemakers, Inc., St. Paul, MN (US)

( * ) Notice: Subject to any disclaimer, the term of this patent is extended or adjusted under 35 U.S.C. 154(b) by 82 days.

(21) Appl. No.: 10/692,315

(22) Filed: Oct. 23, 2003

(65) Prior Publication Data

US 2005/0088145 A1 Apr. 28, 2005

(51) Int. Cl.[7] .............................. H02J 7/00; A61N 1/36; G01N 27/416
(52) U.S. Cl. ........................ 320/132; 607/29; 324/427
(58) Field of Search ....................... 320/132, DIG. 21; 324/426, 427; 607/27–29, 32

(56) References Cited

U.S. PATENT DOCUMENTS

| | | | |
|---|---|---|---|
| 3,103,617 A | 9/1963 | Schneider et al. | 323/279 |
| 3,300,658 A | 1/1967 | Slusher | 327/540 |
| 4,031,899 A | 6/1977 | Renirie | 607/34 |
| 4,134,408 A | 1/1979 | Brownlee et al. | 607/33 |
| 4,259,639 A | 3/1981 | Renirie | 324/430 |
| 4,276,883 A | 7/1981 | McDonald et al. | 607/29 |
| 4,290,429 A | 9/1981 | Blaser | 607/29 |
| 4,323,075 A | 4/1982 | Langer | 607/5 |
| 4,345,604 A | 8/1982 | Renirie | 607/34 |
| 4,408,607 A | 10/1983 | Maurer | 607/61 |
| 4,548,209 A | 10/1985 | Wielders et al. | 607/4 |
| 4,556,061 A | 12/1985 | Barreras et al. | 607/32 |
| 4,606,350 A | 8/1986 | Frost | 607/29 |
| 4,659,994 A | 4/1987 | Poljak | 324/426 |
| 4,672,973 A | 6/1987 | Hofke | 600/476 |
| 4,709,202 A | 11/1987 | Koenck et al. | 320/112 |
| 4,830,006 A | 5/1989 | Haluska et al. | 607/4 |
| 4,868,908 A | 9/1989 | Pless et al. | 323/267 |
| 4,873,490 A | 10/1989 | Hecht et al. | 327/513 |
| 4,952,864 A | 8/1990 | Pless et al. | 323/299 |
| 4,958,641 A | 9/1990 | Digby et al. | 600/515 |
| 5,030,849 A | 7/1991 | Brokaw | 327/513 |
| 5,083,562 A | 1/1992 | De Coriolis et al. | 607/7 |
| 5,137,021 A | 8/1992 | Wayne et al. | 607/28 |

(Continued)

FOREIGN PATENT DOCUMENTS

EP 0739645 10/1996

OTHER PUBLICATIONS

Linden, David, "Handbook of Batteries", pp. 2.1, 2.5-6, 2.25, 14.1 and 14.68.

(Continued)

Primary Examiner—Pia Tibbits
(74) Attorney, Agent, or Firm—Schwegman, Lundberg, Woessner & Kluth, P.A.

(57) ABSTRACT

This document discusses, among other things, a system providing a battery charge indicator for an implantable medical device, such as using a lithium/carbon monofluoride (CFx) or other battery. Capacity vs. voltage data from a separate characterizing battery into a characterizing load impedance is stored in memory, such as in a lookup table or as a regression equation fitted to the data. For the actual battery of interest, then, a battery terminal voltage and a corresponding load current are measured, and a load impedance is calculated. A translation is performed to make the measured battery voltage and the characterizing capacity vs. voltage data comparable, so that a capacity reading can be obtained.

43 Claims, 11 Drawing Sheets

U.S. PATENT DOCUMENTS

| | | | |
|---|---|---|---|
| 5,159,520 A | 10/1992 | Toyooka et al. | 361/103 |
| 5,184,616 A | 2/1993 | Weiss | 607/4 |
| 5,265,588 A | 11/1993 | Nelson | 607/5 |
| 5,285,779 A | 2/1994 | Cameron et al. | 607/5 |
| 5,323,068 A | 6/1994 | Freitas | 326/126 |
| 5,369,364 A | 11/1994 | Renirie et al. | 324/430 |
| 5,370,668 A | 12/1994 | Shelton et al. | 607/29 |
| 5,391,193 A | 2/1995 | Thompson | 607/29 |
| 5,402,070 A | 3/1995 | Shelton et al. | 324/433 |
| 5,424,683 A | 6/1995 | Takahashi | 330/255 |
| 5,447,522 A | 9/1995 | Chang et al. | 607/7 |
| 5,458,624 A | 10/1995 | Renirie et al. | 607/29 |
| 5,483,165 A | 1/1996 | Cameron et al. | 324/427 |
| 5,488,553 A | 1/1996 | Renger | 363/21 |
| 5,496,353 A | 3/1996 | Grandjean et al. | 607/29 |
| 5,527,630 A | 6/1996 | Nagata et al. | 429/7 |
| 5,528,087 A | 6/1996 | Sibata et al. | 307/66 |
| 5,562,595 A | 10/1996 | Neisz | 600/16 |
| 5,591,213 A | 1/1997 | Morgan | 607/5 |
| 5,596,987 A | 1/1997 | Chance | 600/310 |
| 5,620,474 A * | 4/1997 | Koopman | 607/29 |
| 5,675,258 A | 10/1997 | Kadouchi et al. | 324/433 |
| 5,690,685 A | 11/1997 | Kroll et al. | 607/5 |
| 5,700,280 A | 12/1997 | Silvian | 607/5 |
| 5,713,936 A | 2/1998 | Staub | 607/29 |
| 5,721,482 A | 2/1998 | Benvegar et al. | 320/106 |
| 5,741,307 A | 4/1998 | Kroll | 607/5 |
| 5,769,873 A | 6/1998 | Zadech | 607/29 |
| 5,772,689 A | 6/1998 | Kroll | 607/4 |
| 5,779,631 A | 7/1998 | Chance | 600/328 |
| 5,800,472 A | 9/1998 | Mann | 607/29 |
| 5,812,383 A | 9/1998 | Majid et al. | 363/21 |
| 5,869,970 A | 2/1999 | Palm et al. | 324/433 |
| 5,896,423 A | 4/1999 | Okamoto | 375/345 |
| 5,897,576 A | 4/1999 | Olson et al. | 607/5 |
| 5,904,705 A | 5/1999 | Kroll et al. | 607/5 |
| 5,929,601 A | 7/1999 | Kaib et al. | 320/113 |
| 5,959,371 A | 9/1999 | Dooley et al. | 307/130 |
| 6,016,488 A | 1/2000 | Bosworth et al. | 707/4 |
| 6,018,227 A | 1/2000 | Kumar et al. | 320/106 |
| 6,045,941 A | 4/2000 | Milewits | 429/91 |
| 6,108,579 A | 8/2000 | Snell et al. | 607/29 |
| 6,114,838 A | 9/2000 | Brink et al. | 320/136 |
| 6,148,235 A | 11/2000 | Kuiper | 607/29 |
| 6,154,675 A | 11/2000 | Juran et al. | 607/29 |
| 6,167,309 A | 12/2000 | Lyden | 607/29 |
| 6,169,387 B1 | 1/2001 | Kaib | 320/132 |
| 6,185,461 B1 | 2/2001 | Er | 607/27 |
| 6,198,253 B1 | 3/2001 | Kurle et al. | 320/132 |
| 6,313,609 B1 | 11/2001 | Brink | 320/132 |
| 6,366,809 B1 | 4/2002 | Olson et al. | 607/5 |
| 6,472,847 B2 | 10/2002 | Lundberg | 320/132 |
| 6,490,486 B1 | 12/2002 | Bradley | 607/28 |
| 6,584,355 B2 | 6/2003 | Stessman | 607/29 |
| 2003/0176897 A1 | 9/2003 | Stessman | 607/27 |

OTHER PUBLICATIONS

Parsonnet, V., "Cardiac pacing and pacemakers VII. Power sources for implantable pacemakers. Part I.", *American Heart Journal, 94 (4)*, (Oct. 1977),pp. 517-528.

Ryan, J.G., "A Four Chip Implantable Defibrillator/Pacemaker Chipset", *Proceedings of the IEEE 1989 Custom Integrated Circuits Conference*, San Diego, CA,(1989),7.61.-7.6.4.

Sherman, Don , "Measure resistance and capacitance without an A/D", *Philips Semiconductors Application Note AN449*, Philips Semiconductors, Sunnyvale, CA,(Dec. 1993),pp. 2540-2553.

Syracuse, K. , et al., "Addendum to RER 96/169: End of Life (EOL) Characteristics for CFx Cells", *Reliability Evaluation Report*, (Jun. 12, 1996), pp. 2-5.

Takeuchi, E. S., "Energy Storage and Delivery", *Implantable Cardioverter Defibrillators: A Comprehensive Textbook*, edited by N.A. Mark Estes III et al., (1994),123-132.

Takeuchi, E. S., "Lithium/Silver Vanadium Oxide Batteries for Implantable Defibrillators", *PACE, 11,* (Nov. 1988), 2035-2039.

"WG Wilson Greatbatch Ltd. Reliability Evaluation Report—Model/Part No. CFx", Addendum to RER 96/169: End-of-life (EOL) characteristics for CFx cells,(Jun. 12, 1996),1 page.

"WG Wilson Greatbatch Ltd. Reliability Evaluation Reports—Model/Part No.: 9424", Subject: Model 9424 Li/CFx cell fuel gauge,(Aug. 7, 1998),3 pages.

* cited by examiner

BATTERY CHARGE INDICATOR SUCH AS FOR AN IMPLANTABLE MEDICAL DEVICE

TECHNICAL FIELD

This patent application pertains generally to batteries, and more particularly, but not by way of limitation, to a battery charge indicator such as for an implantable medical device.

BACKGROUND

Implantable medical devices include, among other things, cardiac rhythm management (CRM) devices such as pacers, cardioverters, defibrillators, cardiac resynchronization therapy (CRT) devices, as well as combination devices that provide more than one of these therapy modalities to a subject. Such implantable devices are typically powered by a battery. When the battery's useful life has expired, the implanted device is typically explanted and replaced. Therefore, it is often useful to know how much battery energy has been used and/or how much battery energy remains.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION

In the following detailed description, reference is made to the accompanying drawings which form a part hereof, and in which is shown by way of illustration specific embodiments in which the invention may be practiced. These embodiments, which are also referred to herein as "examples," are described in sufficient detail to enable those skilled in the art to practice the invention, and it is to be understood that the embodiments may be combined, or that other embodiments may be utilized and that structural, logical and electrical changes may be made without departing from the scope of the present invention. The following detailed description is, therefore, not to be taken in a limiting sense, and the scope of the present invention is defined by the appended claims and their equivalents.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this documents and those documents so incorporated by reference, the usage in the incorporated reference(s) should be considered supplementary to that of this document; for irreconcilable inconsistencies, the usage in this document controls.

Figure 1:
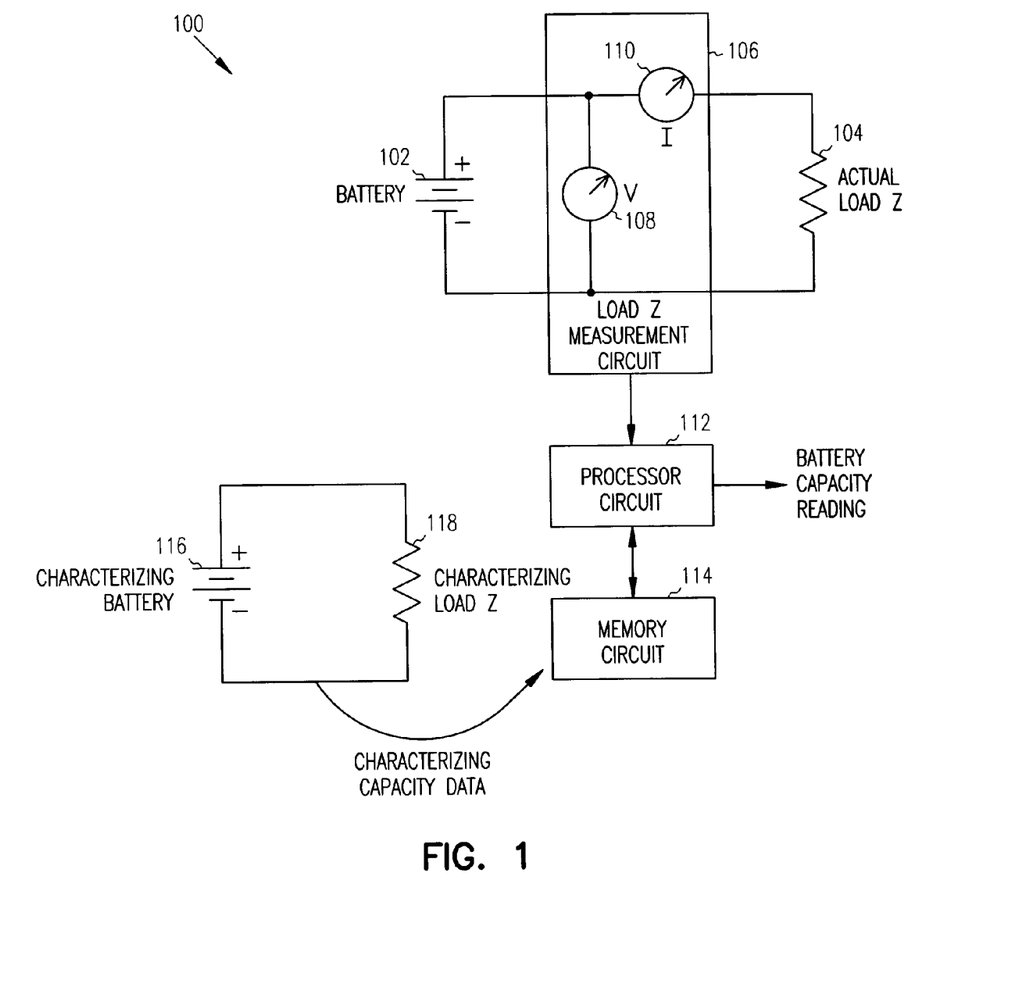
FIG. 1 is a schematic diagram illustrating generally an example of portions of a system that includes a battery and that provides a battery capacity indication.

FIG. 1 is a schematic diagram illustrating generally, by way of example, but not by way of limitation, one example of portions of a system 100. In this example, the system 100 includes a battery 102 for storing energy. The system 100 also provides a battery capacity indication. The battery capacity indication relates to how much of the stored energy has been used (such as by delivering an electrical current to an actual load impedance 104) or to how much of the stored energy remains within the battery 102. In one example, the actual load impedance 104 represents the effective impedance presented by various circuits powered by the battery 102, such as a microprocessor and/or other various circuits in an implantable cardiac rhythm management (CRM) device.

In FIG. 1, the system 100 includes a load impedance measuring circuit 106 for measuring the impedance value of the actual load impedance 104. In this example, the load impedance measuring circuit 106 includes a voltage measuring circuit 108, to measure the terminal voltage across the battery 102, and a current measuring circuit 110, to measure the load current delivered to the actual load impedance 104 by the battery 102.

A microprocessor or similar processor circuit 112 is coupled to the load impedance measuring circuit 106, such as to receive the measured battery terminal voltage value and the measured load current value. The processor 112 calculates the measured load impedance value of the actual load impedance 104 by dividing the measured battery terminal voltage value by the measured load current value. Using the measured load impedance value as an input parameter to battery capacity characterizing data that was previously stored in a memory circuit 114, the processor circuit 112 provides a resulting battery capacity reading. In one example, the processor circuit 112 calculating the battery capacity reading is located in an implantable CRM device. In another example, the processor circuit 112 calculating the battery capacity reading is located in an external device that is communicatively couplable to the implantable CRM device, such as to receive the battery terminal voltage and/or load impedance readings and/or any other needed data upon which the battery capacity reading is based.

In one example, the characterizing battery data stored in the memory circuit 114 is obtained from a separate characterizing battery 116 (or several such batteries 116) that was previously discharged by a characterizing load impedance 118 to obtain the characterizing battery capacity data. In one example, this includes using a battery manufacturer's published capacity vs. voltage data, resulting from the manufacturer's discharge of at least one characterizing battery 116. In other instances, such characterizing data is independently obtained, such as by discharging the characterizing battery 116 through the characterizing test load impedance 118 during a time period, measuring the terminal voltage of the characterizing battery 116 and the characterizing test load current at determinable times during the time period, and calculating the charge removed from the characterizing battery 116 during the time period, such as by exactly or approximately integrating the characterizing test load current.

The separate at least one characterizing battery 116 is manufactured in the same manner as the battery 102, e.g., using substantially the same battery chemistry and substantially the same manufacturing process. However, the characterizing load impedance 118 may differ in value from the actual load impedance 104. For example, to more quickly obtain the characterizing battery capacity data, the characterizing load impedance value may be substantially less than the actual load impedance value, which may take several years to discharge using the actual load impedance 104. Among other things, this document discusses how to translate between the value of the actual load impedance 104 and the characterizing battery capacity data (taken at a possibly different value of a characterizing load impedance 118), such that a meaningful battery capacity reading can be made using the characterizing battery data.

Figure 2:
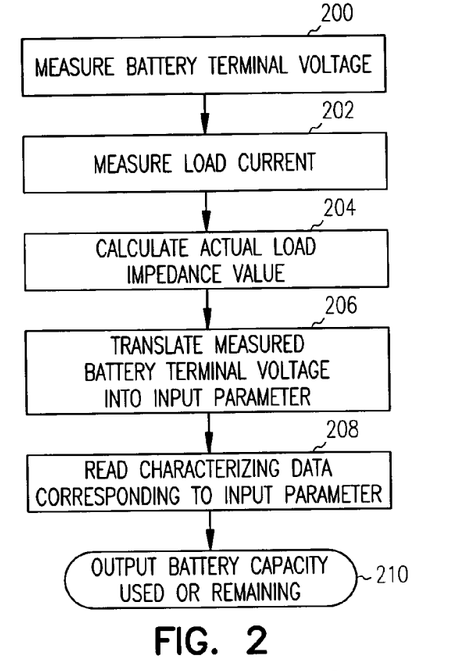
FIG. 2 is a flow chart illustrating generally a technique for obtaining a reading of how much battery capacity has been used (or remains).

FIG. 2 is a flow chart illustrating generally, by way of example, but not by way of limitation, one technique for obtaining a reading of how much battery capacity has been used (or remains). At 200, the terminal voltage of the battery 102 is measured, such as by using the voltage measurement circuit 108. At 202, a corresponding measurement of load current is measured, such as by using the current measurement circuit 110. At 204, an actual load impedance value is calculated, such as by dividing the measured battery terminal voltage by the measured load current using the processor 112. At 206, the measured battery terminal voltage is translated into an adjusted voltage, Vadj, for use as an input parameter into previously stored battery characterizing data in the memory circuit 114, such as capacity vs. voltage data obtained from a different characterizing battery 116 that is substantially identical in chemistry and manufacture to the battery 102. In one example, the adjusted voltage, Vadj, is calculated according to Equation 1.

$$Vadj = Vobs + b * \log\left(\frac{R2}{R1}\right) \quad (1)$$

In Equation 1, R2 is the value of the characterizing test load impedance 118, R1 is the value of the actual load impedance 104, as calculated at 204, b is a coefficient obtained from the characterizing of the battery 116, and Vobs is the battery terminal voltage value of the battery 102, as measured at 200.

At 208, the adjusted voltage, Vadj, is used as an input parameter into previously stored battery capacity vs. voltage characterizing data in the memory circuit 114. In one example, such battery capacity characterizing data is stored in a lookup table. In another example, such battery capacity characterizing data is stored as a fitted or other equation. In either case, the adjusted voltage, Vadj, input parameter yields a resulting battery capacity reading of how much battery capacity has been used (or how much battery capacity remains). At 210, the battery capacity reading is output to either indicate how much battery capacity has already been used, or alternatively, how much battery capacity remains unused in the battery 102.

Figure 3:
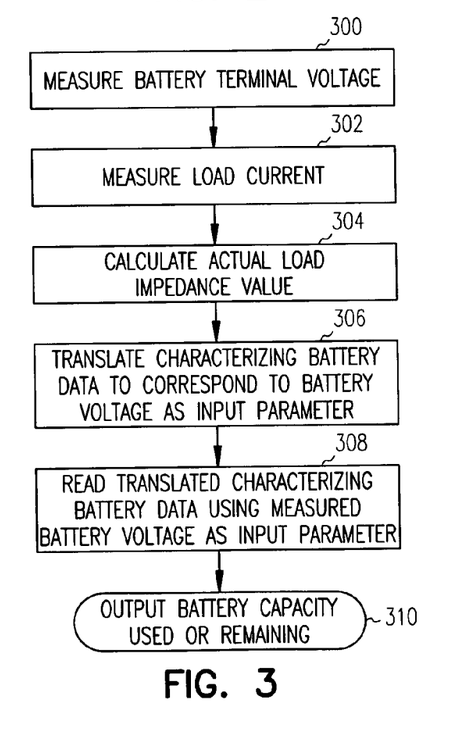
FIG. 3 is a flow chart illustrating generally an alternative technique for obtaining a reading of how much battery capacity has been used (or remains).

FIG. 3 is a flow chart, similar in certain respects to the flow chart of FIG. 2, illustrating generally, by way of example, but not by way of limitation, an alternative technique for obtaining a reading of how much battery capacity has been used (or remains). At 300, the terminal voltage of the battery 102 is measured, such as by using the voltage measurement circuit 108. At 302, a corresponding measurement of load current is measured, such as by using the current measurement circuit 110. At 304, an actual load impedance value is calculated, such as by dividing the measured battery terminal voltage by the measured load current using the processor 112. At 306, the previously stored characterizing capacity vs. voltage battery data (obtained from a separate characterizing battery that is substantially identical in chemistry and manufacture to the battery 102) is translated to make it comparable to the measured battery terminal voltage, which is then used as an input parameter into the translated battery data.

In one example, this includes translating the voltages in the capacity vs. voltage characterizing data for the battery 116, including calculating a scaled voltage, Vscl, in which Vscl=Vtest+b*log (R1/R2), for each voltage, Vtest, in the battery 116 characterization capacity vs. voltage, wherein R2 is a value of the characterizing load impedance 118, and R1 is a value of the actual load impedance 104, and b is a coefficient obtained from characterizing the battery 116.

At 308, the translated capacity vs. voltage data is read using the battery voltage measured at 300 as an input parameter. This yields a corresponding battery capacity reading of how much battery capacity has been used (or how much battery capacity remains). At 310, the battery capacity reading is output to either indicate how much battery capacity has already been used, or alternatively, how much battery capacity remains unused in the battery 102.

Experimental Data Analysis and Calculation of Coefficient "b"

The above battery capacity determination techniques were analyzed for a pacemaker battery using lithium as the anode active material and carbon monofluoride (CFx) as the cathode active material. This CFx battery offers similar volumetric energy as lithium/iodine batteries. The CFx battery also includes, among other benefits, the capability to operate at medium current rates (e.g., between about 50 microamperes and about 500 microamperes) without suffering any substantial loss of battery capacity. Data was analyzed from 96 individual WGL Model 9424 CFx cells tested using a constant load resistance discharge. A promising state-of-charge model was found. The voltage-based model permits an implantable CRM device to provide an elective replacement indicator ("ERI," indicating when the implantable CRM device should be replaced due to a depleted battery), such as over the range from 50% to 90% state of charge of the battery.

Figure 4:
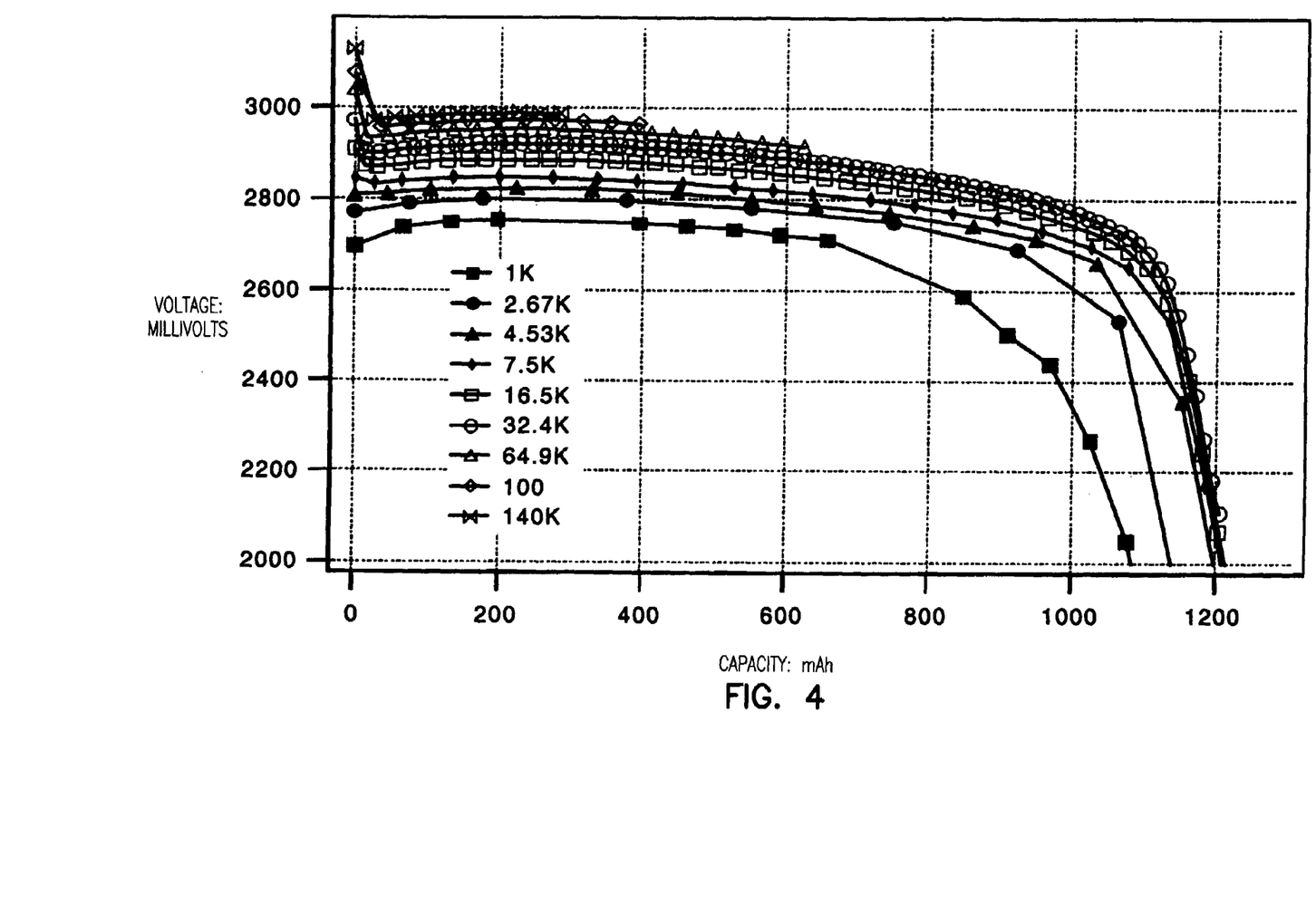
FIG. 4 is a graph of average battery terminal voltage (in millivolts) vs. battery capacity (in milliampere-hours) for each of nine different substantially constant current loads.

First, the inventors analyzed test data that included 12 cells each of WGL Model 9424 CFx batteries, which were placed on nine different constant current loads, for a total test population of 96 batteries. FIG. 4 is a graph of average battery terminal voltage (in millivolts) vs. battery capacity (in milliampere-hours) for each of the nine different substantially constant current loads. A typical DDD pacemaker draws an average current of about 20 microamperes, which, for the battery terminal voltages involved, can be approximately represented as an effective 140 kΩ load impedance. Similarly, other load currents can be represented as effective load impedances (using Ohm's law) for the battery terminal voltages involved. One task included looking for relationships between operating voltage ("battery terminal voltage") and various loads.

Figure 5:
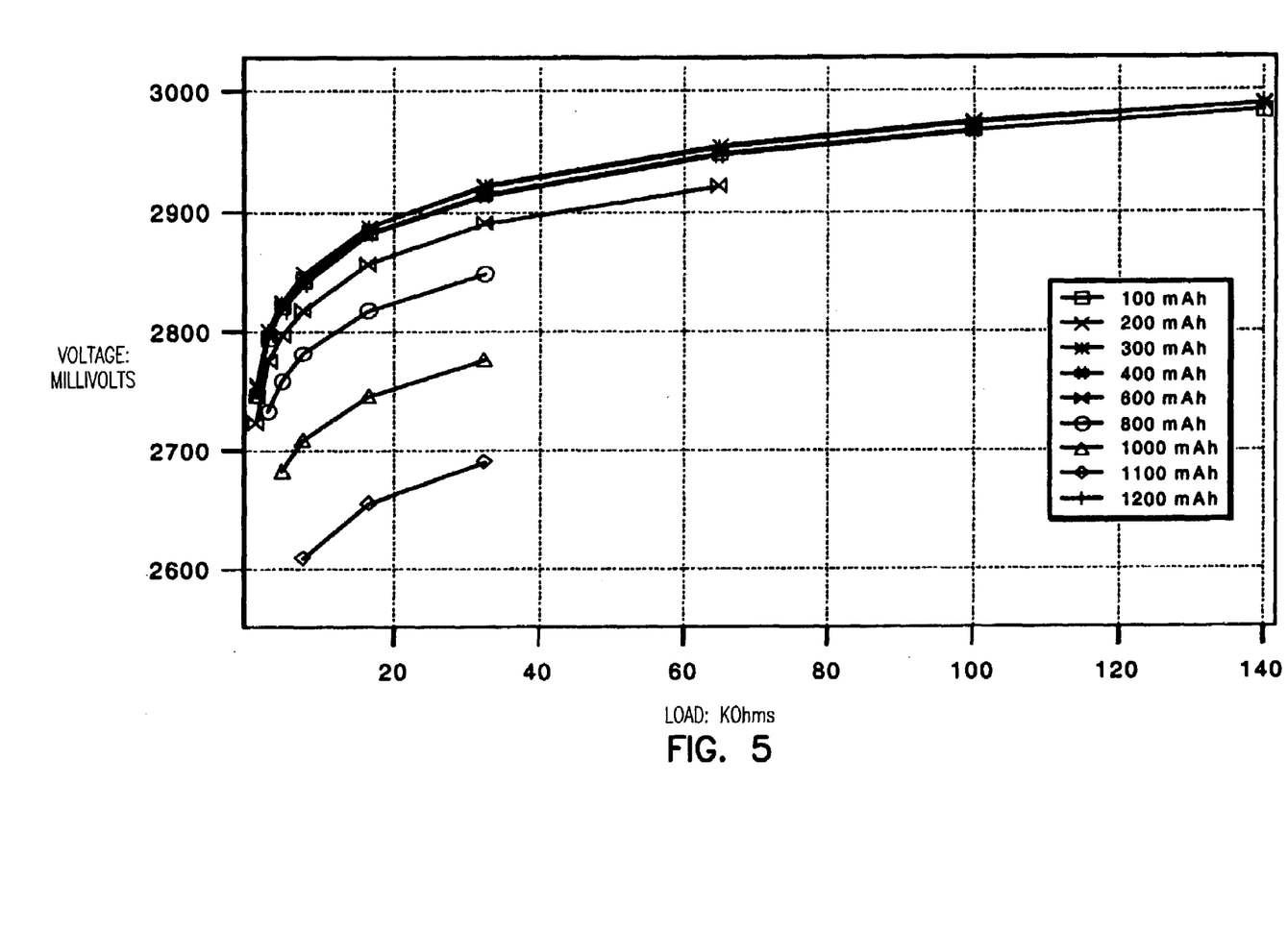
FIG. 5 is a graph of battery terminal voltage (millivolts) vs. load resistance (kilo-ohms), as derived from the data of FIG. 4 at various levels of battery capacity.

FIG. 5 is a graph of battery terminal voltage (millivolts) vs. load resistance (kilo-ohms), as derived from the data of FIG. 4 at various levels of battery capacity. This can be conceptualized as taking vertical slices through the voltage curves in FIG. 4 at successive levels of battery discharge. FIG. 5 exhibits a pronounced exponential curvature, which appears to be consistent across the successive capacity levels. Suspecting that an exponential function underlies the relationship, the same data is plotted on a logarithmic scale of load resistance in FIG. 6.

Figure 6:
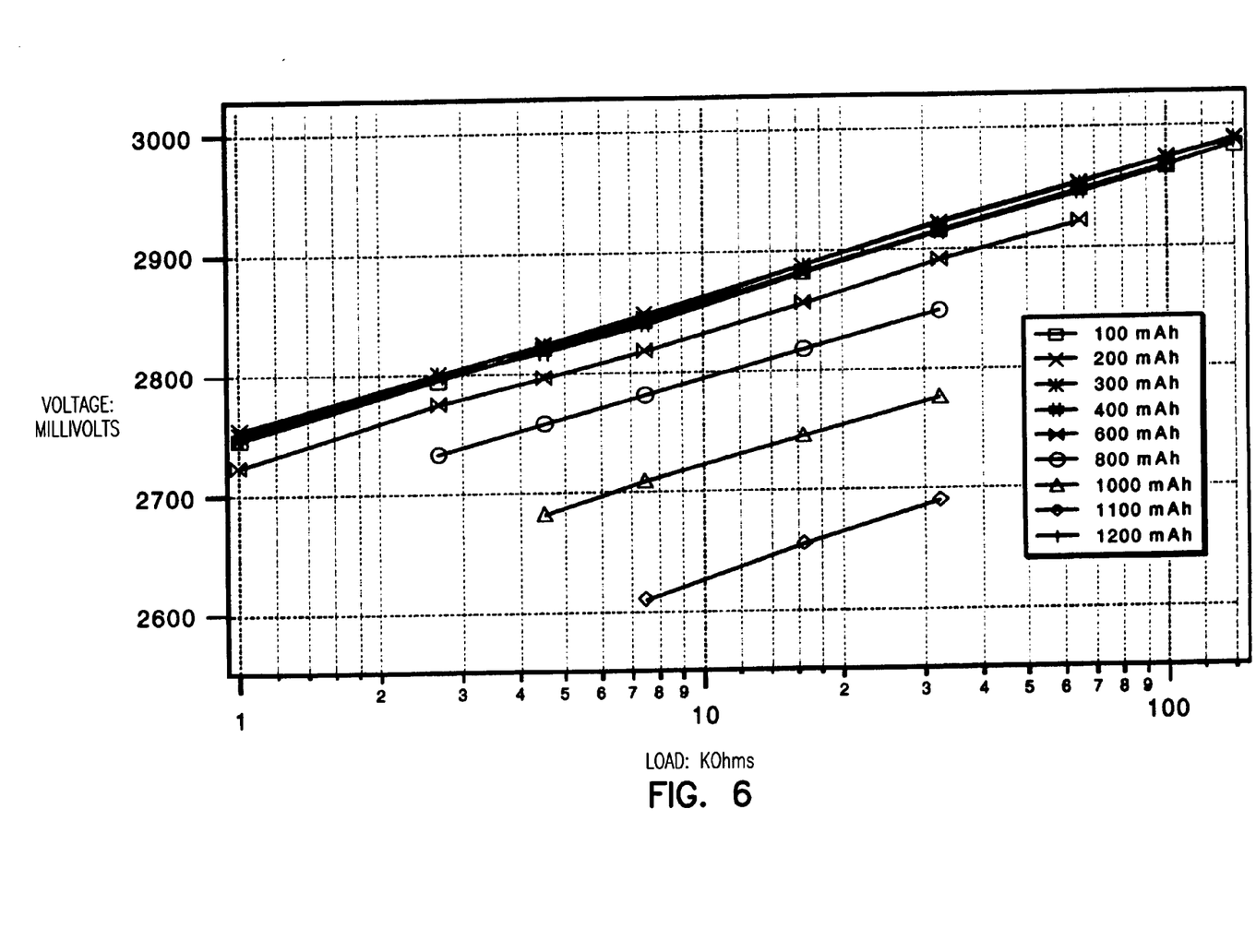
FIG. 6 is a graph of battery terminal voltage (millivolts) vs. load resistance (kilo-ohms), in which the load resistance is plotted on a logarithmic scale.

FIG. 6 indicates that the battery terminal voltage is, at any battery discharge level, a substantially linear function of the logarithm of load resistance. That is, the slope of this linear relationship is substantially constant at levels of discharge that encompass most of the battery capacity. FIG. 6 suggests that the CFx cells follow the Tafel relationship of Equation 2:

$$\eta = a + b \log i \quad (2)$$

In Equation 2, $\eta$=overvoltage (voltage difference from open circuit) and $i$=load current (which can be represented by an approximate load impedance). Equation 2 states that overpotential is a logarithmic function of load current (or load impedance).

Figure 7:
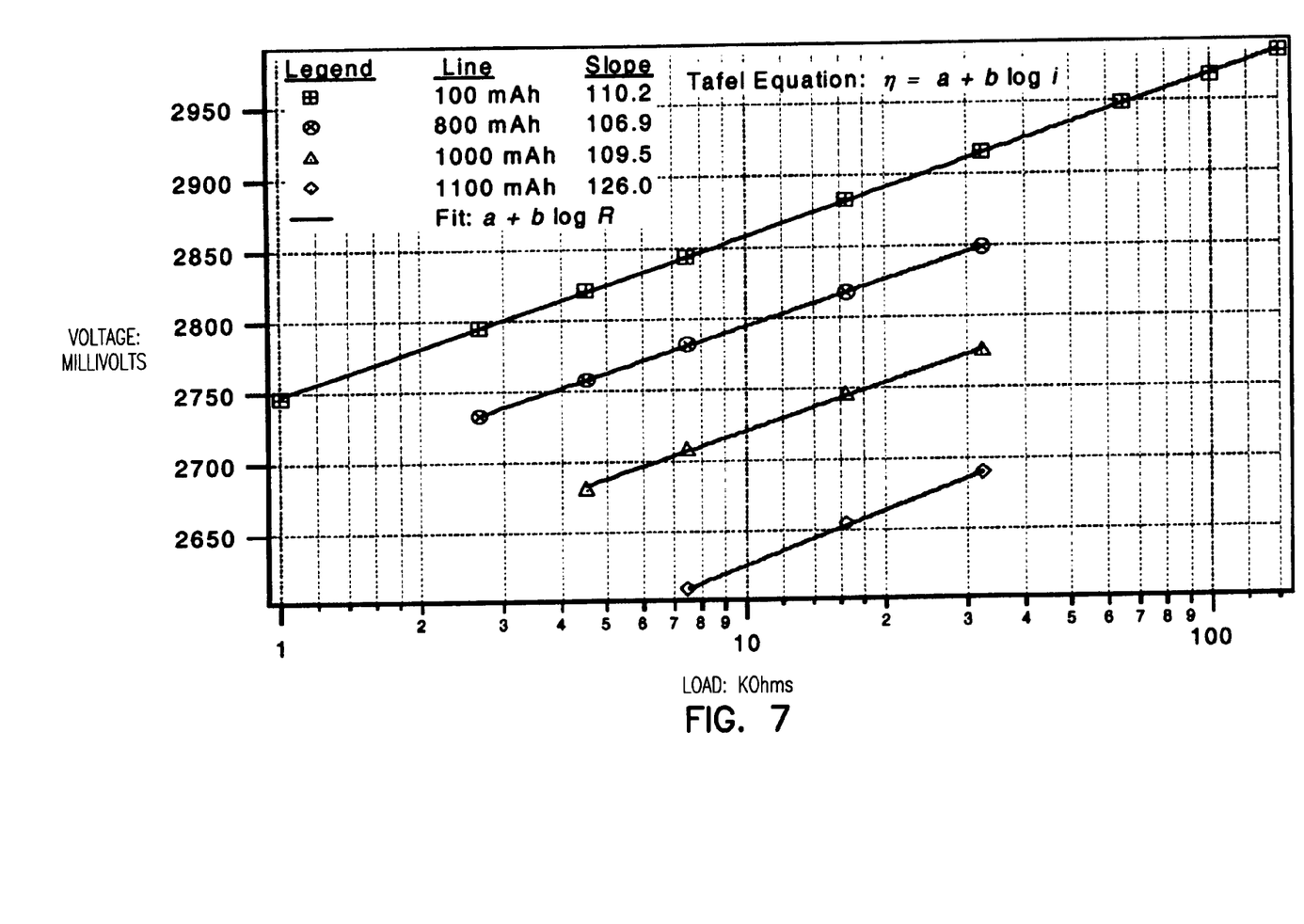
FIG. 7 is a battery terminal voltage (millivolts) vs. load impedance (kilo ohms) graph of four representative fitted curves.

Equation 2 was used as a fitting function for the voltage-load data at several depths of discharge. FIG. 7 is a battery terminal voltage (millivolts) vs. load impedance (kilo-ohms) graph of four representative fitted curves using Equation 2. The statistical fit parameters for these linear regressions are very strong. The pure logarithmic behavior of operating battery terminal voltage is reflected in the very high degree of fit. Thus, Equation 2 is a good model for the CFx battery. The slopes of the fitted curves are also listed in FIG. 7. This slope is the millivolt change to apply in adjusting an observed operating battery terminal voltage at one load resistance to the battery terminal voltage at a second load resistance level. The parallelism of the lines in FIG. 7 indicates that the physical process behind Equation 2 is similar at each of these levels of discharge. The slope appears substantially constant for the continuous levels of discharge between at least 100 milliampere-hours and 1000 milliampere-hours. The precise linear fit and constant slope implies that the relationship of Equation 2 is a good physical model that applies to a wide range of loads over the major portion of the battery's service life. This allows the voltages reconciled for different loads to be compared over the life of the battery.

Continuing with the regressions, Table 1 lists the fit coefficients and statistical parameters for several levels of discharge encompassing the entire capacity range of the cell.

TABLE 1

Fit Parameters for V = a + b log (load impedance in kilo-ohms), at various depths of discharge (DOD).

| DOD | Capacity | co-efficient (a) | co-efficient (b) | R-square $R^2$ | standard error model s | standard error co-efficient (b) se(b) |
|---|---|---|---|---|---|---|
| 0% | 0 | 2683.5 | 197.69 | 99.0% | 12.4 | 5.86 |
| 4% | 50 | 2741.0 | 110.04 | 100.0% | 1.13 | 0.670 |
| 8% | 100 | 2747.7 | 110.18 | 100.0% | 1.13 | 0.537 |
| 17% | 200 | 2754.1 | 109.94 | 100.0% | 1.13 | 0.535 |
| 25% | 300 | 2752.3 | 110.45 | 100.0% | 1.65 | 0.782 |
| 33% | 400 | 2748.2 | 109.05 | 99.9% | 2.21 | 1.200 |
| 50% | 600 | 2752.1 | 108.71 | 99.9% | 2.3 | 1.490 |
| 67% | 800 | 2687.8 | 106.49 | 100.0% | 0.17 | 0.544 |
| 83% | 1000 | 2611.6 | 109.52 | 99.9% | 1.84 | 2.820 |
| 88% | 1050 | 2580.2 | 108.65 | 100.0% | 0.67 | 1.490 |
| 92% | 1100 | 2500.3 | 126.04 | 99.9% | 1.54 | 3.430 |
| 100% | 1200 | 1903.7 | 163.70 | 91.0% | 23.8 | 36.5 |

The relationship of Equation 2 is to be used to adjust the measured battery terminal voltage for a battery 102, at some given actual load impedance 104 value, to that of a standard characterization load impedance 118 value for a separate state-of-charge characterization battery 116. Thus, we are interested in the slope coefficient "b" and its associated standard error. In this example, the slope coefficient "b" is seen to be consistent over a range of capacity, such as from about 50 milliampere-hours to about 1050 milliampere-hours. Therefore, the average slope, b=109.23 mV, over that entire capacity range can be used to accurately translate battery terminal voltage values, at different load impedances, using a single function. The standard error is estimated to be 1.12 mV by averaging the standard errors of the slope coefficients. The calculation of voltage adjusted from resistance $R_1$ to $R_2$ including a 95% confidence interval becomes:

$$V_{adj} = V_{obs} + [109.23 \pm 2.2] \log\left(\frac{R_2}{R_1}\right) \quad (3)$$

In Equation 3, Vadj and Vobs are the adjusted (i.e., translated measured battery voltage) and observed voltages respectively. In this example, this single function of Equation 3 is valid from 4% to 88% depth-of-discharge and from 4.5 kΩ to 140 kΩ. Data for the high resistance loads is still to be collected, but is expected to be consistent with the data analyzed to date.

We can test the model Equation 3 by predicting the average voltage data from FIG. 4. A predicted voltage curve for the 32.4 kΩ load was generated using the 16.5 kΩ actual data. This is done simply by taking every point in the 16.5 kΩ data curve and adding the term:

$$+109.23\left[\log\left(\frac{32.4}{16.5}\right)\right] = 32 \text{ mV} \quad (4)$$

This produces a predicted voltage curve for the 32.4 kΩ load. Plotting predicted values of voltage along with the actual values provides a view of the accuracy of the prediction.

Figure 8:
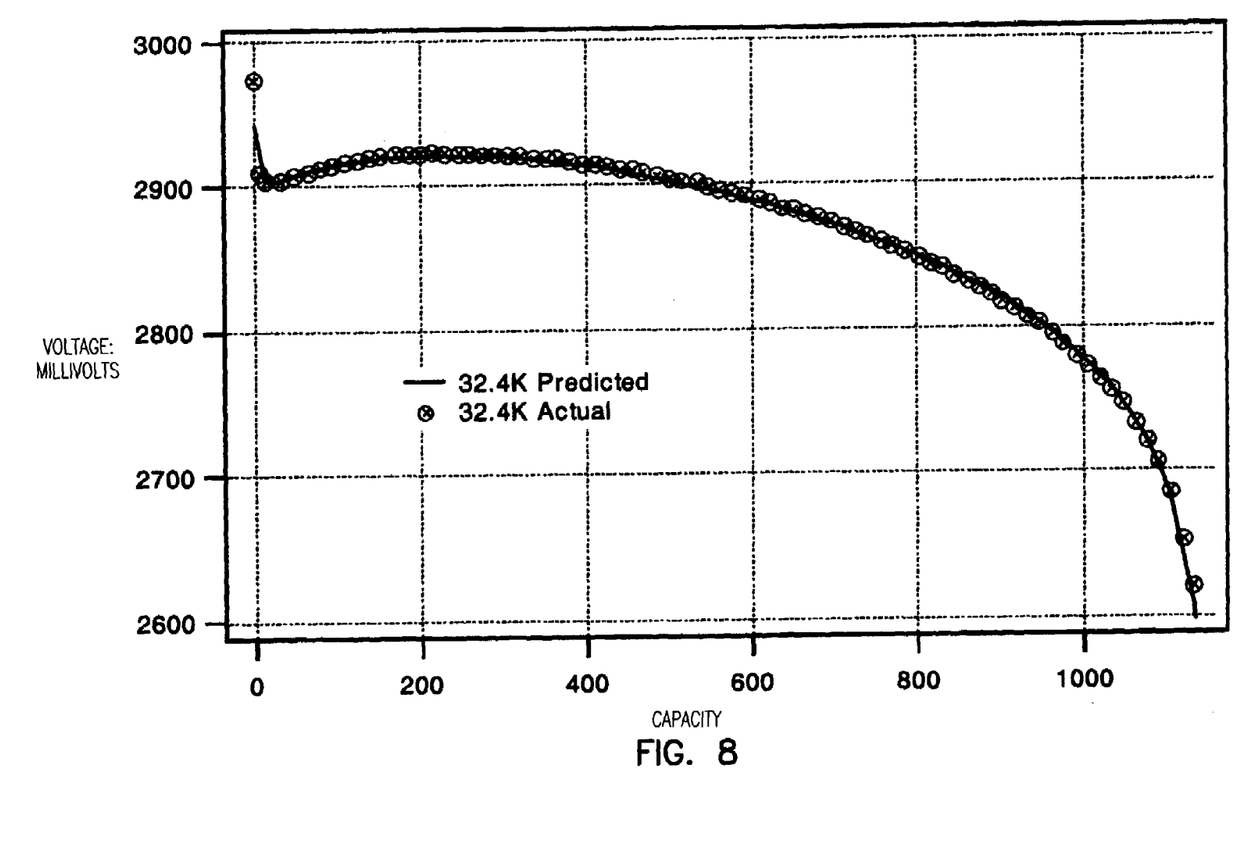
FIG. 8 is a graph of battery terminal voltage (millivolts) vs. capacity (milliampere-hours) using both predicted and actual data for a 32.4 kΩ load impedance.

FIG. 8 is a graph of battery terminal voltage (millivolts) vs. capacity (milliampere-hours) using both predicted and actual data for a 32.4 kΩ load impedance. The accuracy of the fitting function is evident in the close fit of the projected 32.4 kΩ data with the actual 32.4 kΩ data. In this example, the fit is closest in the range from 50 to 1100 milliampere-hours. Precision of the predicted voltage curves was evaluated by examining the residual values between the predicted and actual data.

Figure 9:
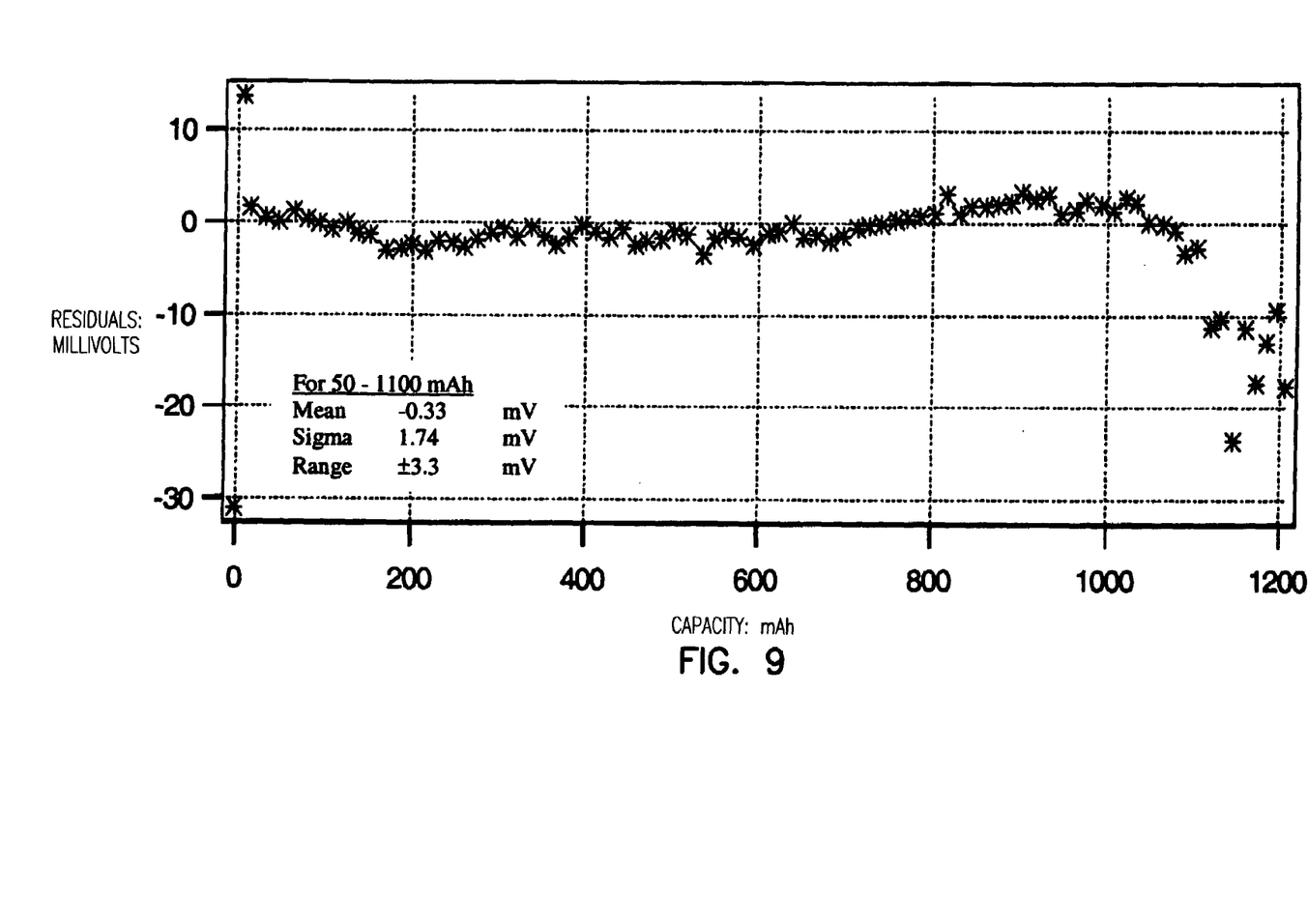
FIG. 9 is a graph of the residuals (millivolts) vs. capacity (milliampere-hours) for the 32.4 kΩ load predicted and actual data of FIG. 8.

FIG. 9 is a graph of the residuals (millivolts) vs. capacity (milliampere-hours) for the 32.4 kΩ predicted and actual data of FIG. 8. The residuals for the 32.4 kΩ data reflect the precision of the fitting function. The zero line represents a perfect fit of the data. In the capacity range from 50 to 1100 milliampere-hours, the average residual is −0.33 mV and the standard error is 1.7 mV. The range of the residuals is ±3.3 mV.

Figure 10:
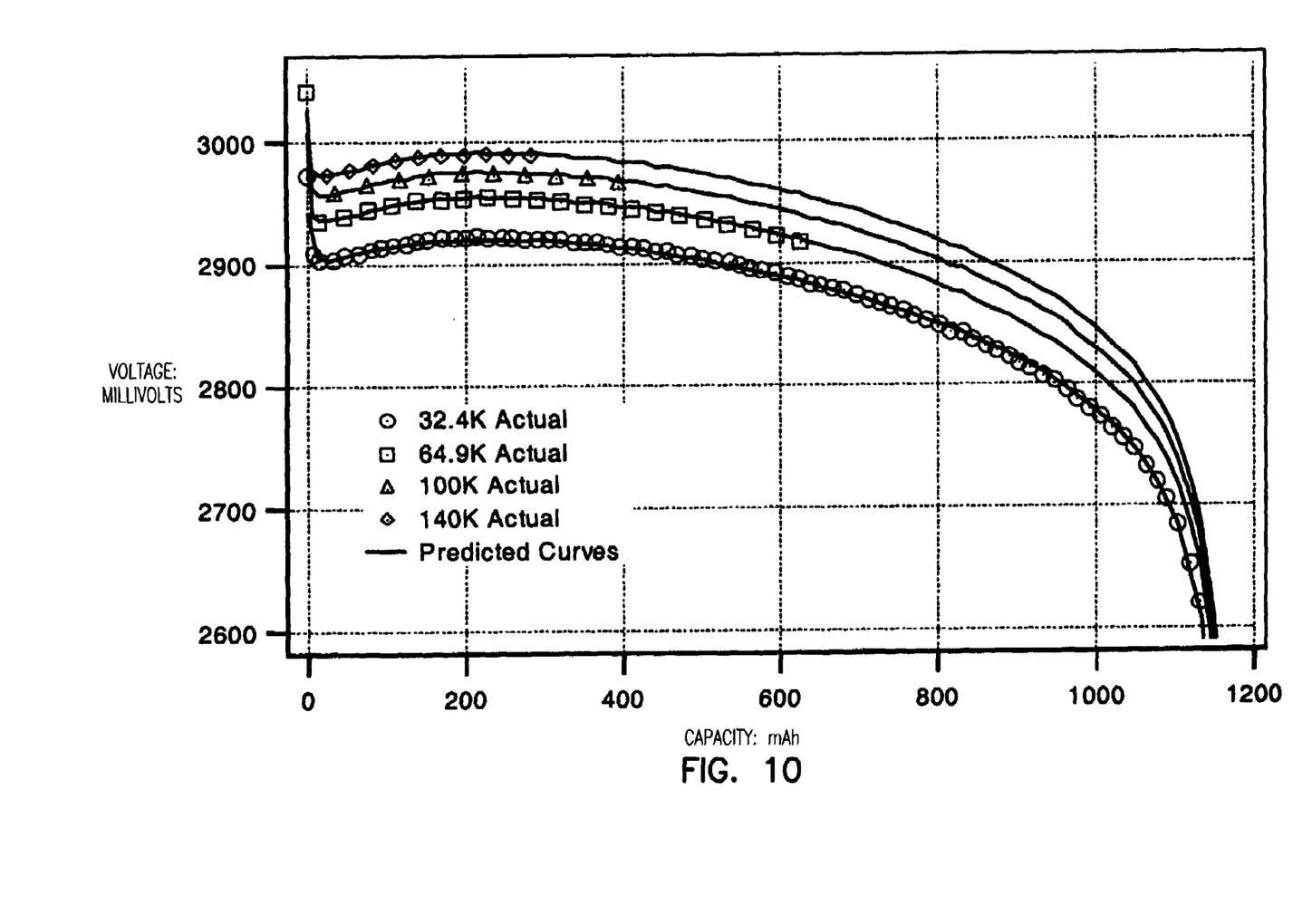
FIG. 10 is a graph of battery terminal voltage (millivolts) vs. capacity (milliampere-hours) for predicted and actual data for several higher resistance loads.

FIG. 10 is a graph of battery terminal voltage (millivolts) vs. capacity (milliampere-hours) for predicted and actual data for several higher resistance loads. The fit appears to be very good at each load. The entire set of predicted voltage curves were generated using the single linear operator demonstrated in Equation 4. FIG. 10 also provides predicted voltage curves for data that is yet to be obtained at the high resistance loads. In the absence of a significant self-discharge effect, these predicted high resistance load curves should be very accurate. The self-discharge rate of commercial CFx cells is believed to be very low, at about 0.5% per year. Therefore, the expected effect of self-discharge is practically negligible.

Figure 11:
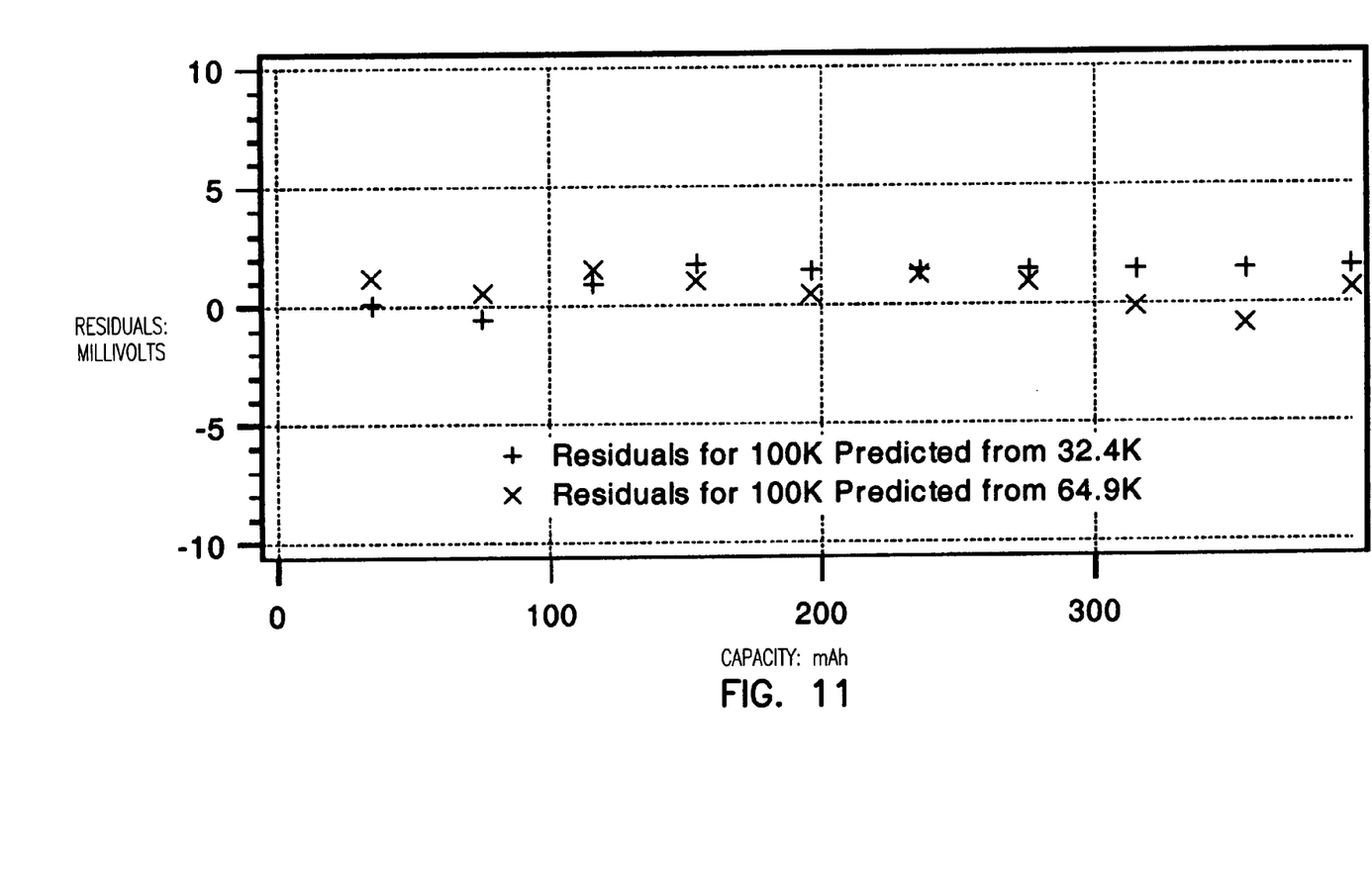
FIG. 11 is a graph of the residuals (millivolts) vs. capacity (milliampere-hours) for the 100 kΩ load predicted data (which was predicted using both 32.4 kΩ load actual data and 64.9 kΩ load actual data) and actual data.

FIG. 11 is a graph of the residuals (millivolts) vs. capacity (milliampere-hours) for the to 100 kΩ predicted data (which was predicted using both 32.4 kΩ actual data and 64.9 kΩ actual data). The graph of FIG. 11 shows that there is no significant difference in choosing the higher 64.9 kΩ data as the predictor. Both sets of data provide an equally good fit to the actual 100 kΩ values. This is consistent with the high degree of linearity of the slope b.

To assess the precision of predicting battery capacity (e.g., used or remaining) from a discharge voltage curve, nonlinear regression was applied to the 32.4 kΩ discharge data (which was chosen as the standard because it was the highest load for which a completed discharge curve was obtained). The nonlinear regression was applied to the region extending from 600 to 1100 milliampere-hours. For this 32.4 kΩ load, all twelve cells were used in order to maximize the statistical strength of the regression. Capacity was used as the output variable since this is the quantity we want to predict.

Figure 12:
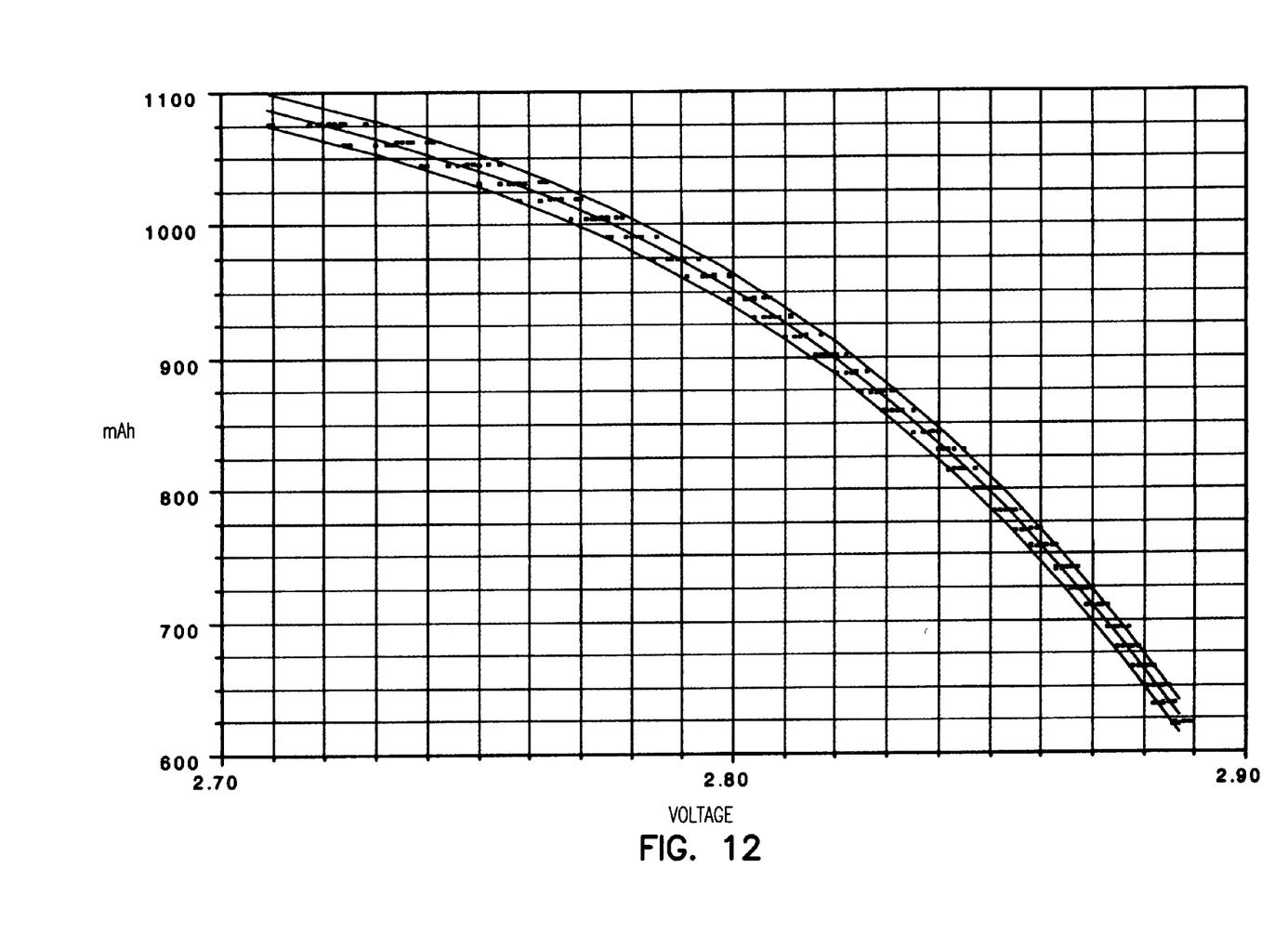
FIG. 12 is a graph of capacity (milliampere-hours) vs. battery terminal voltage (volts), illustrating both the resulting cubic regression line and the lines indicating the 95% prediction interval.

FIG. 12 is a graph of capacity (milliampere-hours) vs. battery terminal voltage (volts), illustrating both the resulting cubic regression line and the lines indicating the 95% prediction interval. The centerline in FIG. 12 is the regression line and the upper and lower curves are the 95% prediction interval upper and lower bounds. The fit is very strong with an $R^2$ of 99.8%. All of the regression terms test significant. Therefore, the cubic equation is appropriate for statistically modeling this portion of the discharge curve, such as the example cubic equation of Equation 5:

$$\text{Capacity}(mA \cdot h) = 732235 - 814455*V + 302761*V^2 - 37557.1*V3 \quad (5)$$

In Equation 5, V is the voltage obtained using the test load impedance 118, which in this example had a value of 32.4 kΩ. The variation of voltage from cell to cell is small enough to allow good discrimination of battery capacity. Roughly estimating the average prediction interval, for a particular voltage value, the capacity can be estimated to within ±10 milliampere-hours.

In view of the above experimental data using CFx batteries, the following example describes how to obtain a battery capacity reading. First, a unique battery terminal voltage reading is obtainable if the battery is discharged beyond 50% of its capacity. For the CFx batteries used, this corresponds to the battery terminal voltage dropping below about 2.95 Volts. Next, a stable battery terminal voltage reading is obtained, along with a corresponding stable load current reading (e.g., either directly, by averaging, or by any other technique). Then, load resistance is calculated, using Ohm's law, from the measured battery terminal voltage and the measured load current. Next, a voltage translation is performed to calculate the battery terminal voltage adjusted to the 32.4 kΩ load impedance for which battery capacity vs. voltage data was previously obtained from a separate characterizing battery 116. An example of this voltage translation is indicated in Equation 6, for a cell which is running at 2.850 Volts and load current of 20 µA, which is equivalent to a load impedance of about 142.5 kΩ.

$$V_{adj} = 2850 + 109 \log\left(\frac{32.4}{142.5}\right) = 2780 \text{ mV} \quad (6)$$

Using the translated battery terminal voltage, Vadj=2.78 V, obtained from Equation 6, as an input parameter into the regression-derived capacity vs. voltage relationship of Equation 5 yields a capacity of 996 milliampere-hours. For a 1200 milliampere hour cell, this indicates that there is about 200 milliampere-hours of remaining battery capacity. When combined with an estimate of the expected average current drain, an estimated time-to-end-of-life is obtained. Some refinements in the method would include the standard errors for the observed voltage and current measurement, and for cell capacity, to produce an expected capacity range, rather than a nominal value as demonstrated above.

It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects.

What is claimed is:

1. A method comprising:
   measuring a first battery voltage of a first battery that is connected to an actual load impedance;

calculating the actual load impedance;
if the actual load impedance differs from a characterizing test load impedance for which capacity vs. voltage characterizing battery data was obtained for a second battery, then computing a translation between the first battery voltage and voltages in the capacity vs. voltage characterizing data for the second battery, computing the translation including using a logarithmic ratio of the characterizing test load impedance and the actual load impedance; and
computing a corresponding battery capacity of the first battery, using the translation and the capacity vs. voltage characterizing data for the second battery.

2. The method of claim 1, in which the calculating the actual load impedance comprises:
measuring a first load current; and
dividing the first battery voltage by the first load current to obtain the actual load impedance.

3. The method of claim 1, further comprising obtaining the capacity vs. voltage characterizing data for the second battery.

4. The method of claim 3, in which the obtaining the capacity vs. voltage characterizing data for the second battery includes using published capacity vs. voltage data provided by a battery manufacturer.

5. The method of claim 3, in which the obtaining the capacity vs. voltage characterizing data for the second battery includes:
discharging the second battery through the characterizing test load impedance during a time period;
measuring the second battery terminal voltage and the characterizing test load current at determinable times during the time period; and
calculating the charge removed from the second battery by exactly or approximately integrating the characterizing test load current.

6. The method of claim 5, further comprising:
obtaining the capacity vs. voltage characterizing data for a plurality of second batteries; and
combining the capacity vs. voltage characterizing data for the plurality of second batteries.

7. The method of claim 6, in which the combining the capacity vs. voltage characterizing data for the plurality of second batteries includes performing a regression on the capacity vs. voltage characterizing data for the plurality of second batteries.

8. The method of claim 1, in which the computing the translation includes translating the first battery voltage to be comparable to the voltages in the capacity vs. voltage characterizing data for the second battery.

9. The method of claim 8, in which translating the first battery voltage comprises calculating an adjusted voltage, Vadj, in which Vadj=Vobs+b*log(R2/R1), and in which R2 is a value of the characterizing test load impedance, R1 is a value of the actual load impedance, b is a coefficient obtained from characterizing the second battery, and Vobs is a value of the measured first battery voltage.

10. The method of claim 9, in which the computing, using the translation, the battery capacity comprises reading a capacity, in the capacity vs. voltage characterizing battery data, that corresponds to the adjusted voltage, Vadj.

11. The method of claim 9, further comprising computing the coefficient b, wherein b is obtained from a slope of terminal voltage vs. logarithm of load impedance data for the second battery.

12. The method of claim 1, in which the computing the translation includes translating the voltages in the capacity vs. voltage characterizing data for the second battery to be comparable to the first battery voltage.

13. The method of claim 12, in which translating the voltages in the capacity vs. voltage characterizing data for the second battery comprises calculating a scaled voltage, Vscl, in which Vscl=Vtest+b*log (R1/R2), for each voltage, Vtest, in the test battery characterization capacity vs. voltage, wherein R2 is a value of the characterizing load impedance, and R1 is a value of the actual load impedance, and b is a coefficient obtained from characterizing the second battery.

14. The method of claim 13, in which the computing, using the translation, the battery capacity comprises reading a capacity, in a scaled representation of the capacity vs. voltage characterizing battery data, that corresponds to the measured first battery voltage.

15. The method of claim 13, further comprising computing the coefficient b, wherein b is obtained from a slope of terminal voltage vs. logarithm of load impedance data for the second battery.

16. The method of claim 1, in which the using the capacity vs. voltage characterizing data for the second battery includes using a lookup table.

17. The method of claim 1, in which the using the capacity vs. voltage characterizing data for the second battery includes using a fitted equation.

18. The method of claim 1, in which at least one of the computing the translation and the computing the corresponding battery capacity of the first battery is performed within an implantable medical device.

19. The method of claim 1, in which at least one of the computing the translation and the computing the corresponding battery capacity of the first battery is performed by an external remote interface that is communicatively couplable to an implantable medical device.

20. The method of claim 1, in which the computing the corresponding battery capacity of the first battery comprises computing an unused battery capacity remaining in the first battery.

21. The method of claim 1, in which the computing the corresponding battery capacity of the first battery comprises computing an already used amount of the battery capacity of the first battery.

22. A computer readable medium including instructions for performing the method of claim 1.

23. A system comprising:
a load impedance;
an implantable first battery, coupled to the load impedance;
a battery terminal voltage measurement circuit, coupled to the first battery to measure a first battery voltage;
a load impedance measurement circuit, coupled to the load impedance to measure an actual load impedance; and
a processor circuit, communicatively coupled to the battery terminal voltage measurement circuit and the load impedance measurement circuit, the processor associated with a separate or integral memory circuit to store capacity vs. voltage characterizing data obtained from a second battery under a characterizing test load impedance, the processor including instructions to compute a translation between the first battery voltage and voltages in the capacity vs. voltage characterizing data for the second battery, including using a logarithmic ratio of the characterizing test load impedance and the actual load impedance, and using the translation to compute a corresponding battery capacity of the first battery using the capacity vs. voltage characterizing data for the second battery.

24. The system of claim 23, in which the load impedance comprises operational circuitry of an implantable cardiac rhythm management device.

25. The system of claim 23, in which the first battery comprises a lithium/carbon monofluoride battery.

26. The system of claim 23, in which the load impedance measurement circuit comprises a load current measurement circuit to measure load current, and wherein the load impedance measurement circuit is configured to determine the actual load impedance from a ratio of the first battery voltage to the load current.

27. The system of claim 23, in which the memory circuit stores capacity vs. voltage characterizing data for the second battery obtained from published capacity vs. voltage data provided by a battery manufacturer.

28. The system of claim 23, in which the memory circuit stores capacity vs. voltage characterizing data for the second battery obtained from discharging the second battery through the characterizing test load impedance during a time period, measuring the second battery terminal voltage and the characterizing test load current at determinable times during the time period, and calculating the charge removed from the second battery by exactly or approximately integrating the characterizing test load current.

29. The system of claim 28, in which the memory circuit stores capacity vs. voltage characterizing data for the second battery that is obtained for a plurality of second batteries and combined.

30. The system of claim 23, in which the processor includes instructions to compute the translation, including translating the first battery voltage to be comparable to the voltages in the capacity vs. voltage characterizing data for the second battery.

31. The system of claim 23, in which the processor includes instructions to compute the translation, including translating the first battery voltage, comprising calculating an adjusted voltage, Vadj, in which Vadj=Vobs+b*log(R2/R1), and in which R2 is a value of the characterizing test load impedance, R1 is a value of the actual load impedance, b is a coefficient obtained from characterizing the second battery, and Vobs is a value of the measured first battery voltage.

32. The system of claim 31, in which the processor includes instructions to compute the battery capacity, using the translation, comprising reading a capacity, in the capacity vs. voltage characterizing battery data, that corresponds to the adjusted voltage, Vadj.

33. The system of claim 31, in which the processor includes instructions to compute the coefficient b, wherein b is obtained from a slope of terminal voltage vs. logarithm of load impedance data for the second battery.

34. The system of claim 23, in which the processor includes instructions to compute the translation, including translating the voltages in the capacity vs. voltage characterizing data for the second battery to be comparable to the first battery voltage.

35. The system of claim 30, in which the processor includes instructions to translate the voltages in the capacity vs. voltage characterizing data for the second battery comprising calculating a scaled voltage, Vscl, in which Vscl=Vtest+b*log (R1/R2), for each voltage, Vtest, in the test battery characterization capacity vs. voltage, wherein R2 is a value of the characterizing load impedance, and R1 is a value of the actual load impedance, and b is a coefficient obtained from characterizing the second battery.

36. The system of claim 35, in which the processor includes instructions for computing the battery capacity, using the translation, the computing comprising reading a capacity, in a scaled representation of the capacity vs. voltage characterizing battery data, which corresponds to the measured first battery voltage.

37. The system of claim 35, in which the processor includes instructions for computing the coefficient b, wherein b is obtained from a slope of terminal voltage vs. logarithm of load impedance data for the second battery.

38. The system of claim 23, in which the memory circuit includes the capacity vs. voltage characterizing data for the second battery as a lookup table.

39. The system of claim 23, in which the memory circuit includes the capacity vs. voltage characterizing data for the second battery as a fitted equation.

40. The system of claim 23, in which the processor is located within an implantable medical device.

41. The system of claim 23, in which the processor is located within an external interface unit that is communicatively couplable to an implantable medical device.

42. The system of claim 23, in which the processor includes instructions for computing a remaining capacity of the first battery.

43. The system of claim 23, in which the processor includes instructions for computing an already used capacity of the first battery.

* * * * *